(12) United States Patent
Shin

(10) Patent No.: US 11,598,814 B2
(45) Date of Patent: Mar. 7, 2023

(54) BATTERY MANAGEMENT APPARATUS AND METHOD

(71) Applicant: LG CHEM, LTD., Seoul (KR)

(72) Inventor: Hak-Yong Shin, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 169 days.

(21) Appl. No.: 15/733,968

(22) PCT Filed: Jan. 6, 2020

(86) PCT No.: PCT/KR2020/000205
§ 371 (c)(1),
(2) Date: Dec. 1, 2020

(87) PCT Pub. No.: WO2020/149557
PCT Pub. Date: Jul. 23, 2020

(65) Prior Publication Data
US 2021/0239763 A1 Aug. 5, 2021

(30) Foreign Application Priority Data
Jan. 18, 2019 (KR) .......................... 10-2019-0007120

(51) Int. Cl.
*G01R 31/3835* (2019.01)
*H01M 10/42* (2006.01)
*H01M 10/48* (2006.01)

(52) U.S. Cl.
CPC ...... *G01R 31/3835* (2019.01); *H01M 10/425* (2013.01); *H01M 10/48* (2013.01); *H01M 2010/4271* (2013.01)

(58) Field of Classification Search
None
See application file for complete search history.

(56) References Cited

U.S. PATENT DOCUMENTS

2006/0093896 A1 5/2006 Hong et al.
2007/0210752 A1 9/2007 Yoon
(Continued)

FOREIGN PATENT DOCUMENTS

CN 105955863 A 9/2016
EP 2 712 018 A1 3/2014
(Continued)

OTHER PUBLICATIONS

Extended European Search Report ('EESR') Application No. 20741385.7 dated Nov. 19, 2021.
(Continued)

*Primary Examiner* — Roy Y Yi
(74) *Attorney, Agent, or Firm* — Birch, Stewart, Kolasch & Birch, LLP

(57) ABSTRACT

A battery management apparatus according to the present disclosure includes a voltage measuring unit for measuring a battery voltage of a battery, a degree of bending measuring unit provided on at least one side of the battery for measuring a degree of battery bending of the battery, and a processor for receiving the battery voltage from the voltage measuring unit, receiving the degree of battery bending from the degree of bending measuring unit, setting a base degree of bending according to a voltage range to which the battery voltage belongs among an overdischarge voltage range, an allowable voltage range and an overcharge voltage range, comparing the degree of battery bending with the base degree of bending to determine which is greater, and performing a protection operation for the battery based on a degree of bending comparison result.

17 Claims, 9 Drawing Sheets

(56) References Cited

U.S. PATENT DOCUMENTS

| | | |
|---|---|---|
| 2010/0164430 A1 | 7/2010 | Lu et al. |
| 2013/0249494 A1 | 9/2013 | Ju et al. |
| 2016/0141729 A1 | 5/2016 | Kim |
| 2016/0380317 A1* | 12/2016 | Lin .................... H01M 10/482 324/427 |
| 2020/0158596 A1 | 5/2020 | Kim et al. |

FOREIGN PATENT DOCUMENTS

| | | |
|---|---|---|
| JP | 2003-59484 A | 2/2003 |
| JP | 2010-32349 A | 2/2010 |
| JP | 2012-146447 A | 8/2012 |
| JP | 2012-190600 A | 10/2012 |
| JP | 2016-76335 A | 5/2016 |
| JP | 5935744 B2 | 6/2016 |
| KR | 10-2005-0081944 A | 8/2005 |
| KR | 10-2006-0037841 A | 5/2006 |
| KR | 10-2008-0109121 A | 12/2008 |
| KR | 10-2009-0120268 A | 11/2009 |
| KR | 10-2012-0023369 A | 3/2012 |
| KR | 10-2017-0123093 A | 11/2017 |
| KR | 10-1839405 B1 | 3/2018 |
| KR | 10-2018-0073764 A | 7/2018 |
| KR | 10-2018-0087041 A | 8/2018 |
| KR | 10-2018-0093584 A | 8/2018 |
| WO | WO 2017/222333 A1 | 12/2017 |

OTHER PUBLICATIONS

International Search Report (PCT/ISA/210) issued in PCT/KR2020/000205 dated Apr. 16, 2020.

* cited by examiner

BATTERY MANAGEMENT APPARATUS AND METHOD

TECHNICAL FIELD

The present application claims the benefit of Korean Patent Application No. 10-2019-0007120 filed on Jan. 18, 2019 with the Korean Intellectual Property Office, the disclosure of which is incorporated herein by reference in its entirety.

The present disclosure relates to a battery management apparatus and method, and more particularly, to a battery management apparatus and method for managing a battery according to a result of measuring how much the battery is bent.

BACKGROUND ART

Due to their high applicability to various products and electrical properties such as a high energy density, secondary batteries are not only commonly applied to mobile devices but also electric vehicles (EVs) or hybrid electric vehicles (HEVs) that are driven by an electrical driving source and energy storage systems. Secondary batteries are gaining attention for their primary advantage of remarkably reducing the use of fossil fuels and not generating by-products from the use of energy, making them a new eco-friendly and energy efficient source of energy.

The battery pack includes a plurality of cell assemblies connected in series, each cell assembly including a plurality of unit cells, to obtain high output. The unit cell includes positive and negative electrode current collectors, a separator, an active material and an electrolyte solution and can be repeatedly recharged by electrochemical reactions between the components.

Recently, with the growing need for large capacity structure for use as a source of energy, there is an increasing demand for a battery pack of multi-modal structure including a plurality of battery modules, each battery module including a plurality of secondary batteries connected in series and/or in parallel.

The battery pack is used in various environments, and thus may be exposed to various external impacts. When the battery pack is bent or deformed in a particular direction due to an external impact applied to the battery pack, the internal parts of the battery pack are damaged. One of methods for detecting the external impact applied to the battery pack is an impact detection method using an elastic body such as a spring.

However, as described above, with the growing demand for large capacity structure, the weight of the battery pack gradually increases, and in this circumstance, the impact detection method using only an elastic body such as a spring has a limitation.

DISCLOSURE

Technical Problem

The present disclosure is designed to solve the above-described problem, and therefore the present disclosure is directed to providing a battery management apparatus and method that measures how much a battery is bent (degree of battery bending), and performs a battery protection operation according to the measured degree of battery bending.

Technical Solution

A battery management apparatus according to an aspect of the present disclosure may include a voltage measuring unit including a voltage sensor and configured to measure a battery voltage of a battery, a degree of bending measuring unit including a flexible sensor, provided on at least one side of the battery and configured to measure a degree of battery bending of the battery, and a processor configured to receive the battery voltage from the voltage measuring unit, receive the degree of battery bending from the degree of bending measuring unit, set a base degree of bending according to a voltage range to which the battery voltage belongs among an overdischarge voltage range, an allowable voltage range and an overcharge voltage range, compare the degree of battery bending with the base degree of bending to determine which is greater, and preform a protection operation for the battery based on a degree of bending comparison result.

The processor may be configured to set the base degree of bending as a first reference degree of bending when the battery voltage is included in the overdischarge voltage range, set the base degree of bending as a second reference degree of bending when the battery voltage is included in the allowable voltage range, and set the base degree of bending as a third reference degree of bending when the battery voltage is included in the overcharge voltage range.

The third reference degree of bending may be set to be less than the first reference degree of bending and less than the second reference degree of bending.

The processor may be configured to, when the battery voltage changes after the base degree of bending is set, change the base degree of bending to correspond to the changed battery voltage.

When there is a change in the battery voltage and a consequential change in the voltage range to which the battery voltage belongs, the processor may be configured to change the set base degree of bending to correspond to the changed voltage range.

The processor may be configured to set a base time to correspond to the voltage range to which the battery voltage belongs, compare an excess time with the base time to determine which is longer, the excess time being a time that passes from a time point at which the degree of battery bending exceeds the base degree of bending, and perform the protection operation for the battery based on a time comparison result.

The processor may be configured to set the base time as a first reference time when the battery voltage is included in the overdischarge voltage range, set the base time as a second reference time the battery voltage is included in the allowable voltage range, and set the base time as a third reference time when the battery voltage is included in the overcharge voltage range.

The third reference time may be set to be less than the first reference time and less than the second reference time.

The processor may be configured to, when the battery voltage changes after the base time is set, change the base time to correspond to the changed battery voltage.

When there is a change in the battery voltage and a consequential change in the voltage range to which the battery voltage belongs, the processor may be configured to change the set base time to the reference time corresponding to the changed voltage range.

The processor may be configured to, when the battery voltage changes after the base degree of bending and the base time are set, change the base degree of bending and the base time to correspond to the changed battery voltage.

The battery may be a battery module including a plurality of battery cells.

The voltage measuring unit may be configured to measure a voltage of the battery module and each of the plurality of battery cells.

The degree of bending measuring unit may be provided in the battery module and each of the plurality of battery cells and is configured to measure a degree of bending of the battery module and each of the plurality of battery cells.

The processor may be configured to determine whether there is a failure in the battery module based on a degree of bending comparison result and a time comparison result of the battery module, and when it is determined that there is the failure in the battery module, detect a failing cell among the plurality of battery cells based on a degree of bending comparison result and a time comparison result for each of the plurality of battery cells.

A battery pack according to another aspect of the present disclosure may include the battery management apparatus according to an aspect of the present disclosure.

A battery management method according to still another aspect of the present disclosure may include a voltage measuring step of measuring a battery voltage of a battery, a degree of bending measuring step of measuring a degree of battery bending of the battery, a base degree of bending setting step of setting a base degree of bending according to a voltage range in which the battery voltage is included among an overdischarge voltage range, an allowable voltage range and an overcharge voltage range, and a protection operation performing step of comparing the degree of battery bending with the base degree of bending to determine which is greater, and performing a protection operation for the battery based on a degree of bending comparison result.

Advantageous Effects

According to an aspect of the present disclosure, it is possible to prevent an accident that may occur due to the battery by performing the protection operation for the battery when an external impact is applied to the battery or battery swelling occurs.

Additionally, according to an aspect of the present disclosure, it is possible to perform the protection operation for the battery to correspond to the current state of the battery by changing the base degree of bending and/or the base time depending on the voltage of the battery.

The effects of the present disclosure are not limited to the effects mentioned above, and these and other effects will be clearly understood by those skilled in the art from the appended claims.

BRIEF DESCRIPTION OF DRAWINGS

The accompanying drawings illustrate preferred embodiments of the present disclosure, and together with the following detailed description, serve to provide a further understanding of the technical features of the present disclosure. However, the present disclosure is not to be construed as being limited to the drawings.

MODE FOR DISCLOSURE

Figure 1:
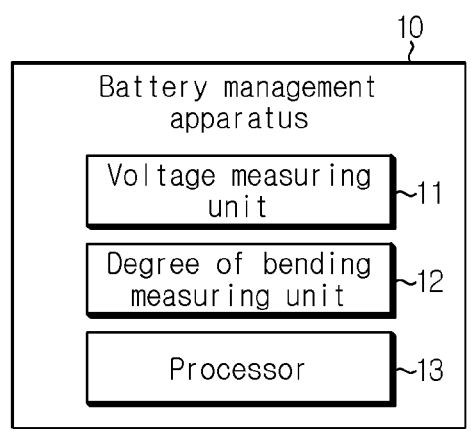
FIG. 1 is a schematic diagram showing a battery management apparatus according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as limited to general and dictionary meanings, and should be interpreted based on the meanings and concepts corresponding to technical aspects of the present disclosure on the basis of the principle that the inventor is allowed to define terms appropriately for the best explanation. Therefore, the embodiments described herein and illustrations shown in the drawings are just a most preferred embodiment of the present disclosure, but not intended to fully describe the technical aspects of the present disclosure, so it should be understood that other equivalents and modifications could be made thereto at the time of filing the application.

Figure 2:
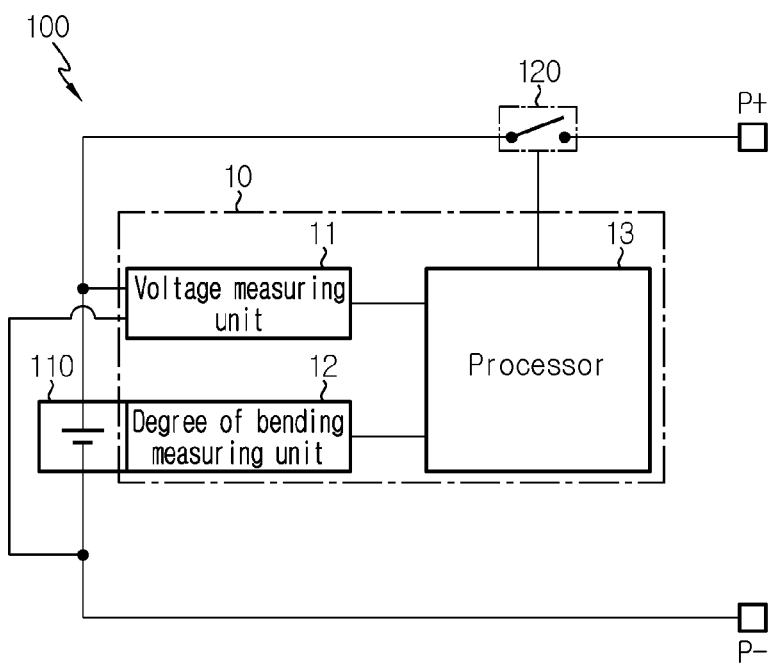
FIG. 2 is a diagram showing an exemplary configuration of a battery pack including a battery management apparatus according to an embodiment of the present disclosure.

FIG. 1 is a schematic diagram showing a battery management apparatus 10 according to an embodiment of the present disclosure. FIG. 2 is a diagram showing an exemplary configuration of a battery pack 100 including the battery management apparatus 10 according to an embodiment of the present disclosure.

Referring to FIG. 2, the battery pack 100 may include at least one battery 110 and a battery management apparatus 10.

Here, the battery 110 may be a battery cell or a battery module.

That is, the battery 110 may be a physically separable independent cell having a negative electrode terminal and a positive electrode terminal. For example, a pouch-type lithium polymer cell and/or a cylindrical cell may be regarded as the battery 110. The battery 110 may be also a battery module including at least one battery cell connected in series and/or in parallel. For convenience of description, the following description is made based on the battery 110 being a battery cell.

Referring to FIGS. 1 and 2, the battery management apparatus 10 according to an embodiment of the present disclosure may include a voltage measuring unit 11, a degree of bending measuring unit 12 and a processor 13.

The voltage measuring unit 11 may be configured to measure the battery voltage of the battery 110. To this end, the voltage measuring unit 11 may include a voltage sensor.

The voltage measuring unit 11 may periodically measure the battery voltage of the battery 110, and output a measurement signal indicating the measured battery voltage to the processor 13.

For example, in the embodiment of FIG. 2, the voltage measuring unit 11 may be connected to two terminals of the battery 110 through a plurality of sensing lines. Additionally, the voltage measuring unit 11 may measure the battery voltage based on the voltage across the battery 110 measured at the plurality of sensing lines.

The degree of bending measuring unit 12 may be provided on at least one side of the battery 110 and configured to measure the degree of battery bending of the battery 110. To this end, the degree of bending measuring unit 12 may include a flexible sensor that changes the output resistance value depending on the degree of bending.

Here, the degree of battery bending may refer to how much the battery 110 is bent. For example, when an external impact is applied to the battery 110, the battery 110 may bend. Additionally, when the battery 110 swells, the battery 110 may bend. Accordingly, the degree of bending measuring unit 12 may be attached to one surface of the battery 110 to measure the degree of battery bending about how much the battery 110 is bent and output the measured degree of battery bending.

Figure 3:
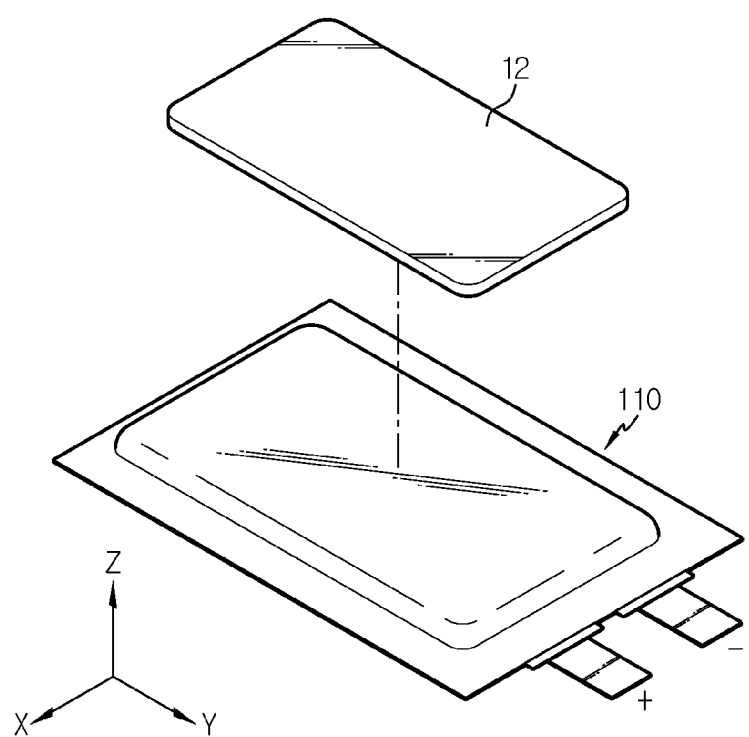
FIG. 3 is a diagram showing an exemplary configuration of a battery according to an embodiment of the present disclosure.

FIG. 3 is a diagram showing an exemplary configuration of the battery 110 according to an embodiment of the present disclosure. In detail, FIG. 3 is a diagram showing an example of the degree of bending measuring unit 12 of the battery management apparatus 10 according to an embodiment of the present disclosure, attached to the battery 110.

For example, referring to FIG. 3, when the battery 110 is a pouch-type battery cell, the degree of bending measuring unit 12 may be attached to the outer surface of the battery 110. The degree of bending measuring unit 12 may measure how much the battery 110 is bent by an external impact and/or swelling.

The degree of bending measuring unit 12 may periodically measure the degree of battery bending of the battery 110, and output a measurement signal indicating the measured degree of battery bending to the processor 13.

For example, the degree of bending measuring unit 12 may output the natural number of between "0" and "100" as the degree of bending. When there is no shape change of the battery 110, the degree of battery bending may be measured as "0". When there is a shape change of the battery 110, the measured degree of battery bending may be greater than "0".

The processor 13 may be operably coupled to the voltage measuring unit 11 and the degree of bending measuring unit 12. The processor 13 may receive the battery voltage from the voltage measuring unit 11. Additionally, the processor 13 may receive the degree of battery bending from the degree of bending measuring unit 12.

For example, in the embodiment of FIG. 2, the voltage measuring unit 11 and the degree of bending measuring unit 12 may be electrically connected to the processor 13. The battery voltage outputted from the voltage measuring unit 11 may be inputted to the processor 13. The degree of battery bending outputted from the degree of bending measuring unit 12 may be inputted to the processor 13.

The processor 13 may be configured to set a base degree of bending according to a voltage range in which the battery voltage is included among an overdischarge voltage range, an allowable voltage range and an overcharge voltage range.

That is, the processor 13 may set the base degree of bending for the battery 110 according to the voltage range to which the battery voltage of the battery 110 belongs.

In detail, the processor 13 may determine the voltage range in which the battery voltage received from the voltage measuring unit 11 is included among the overdischarge voltage range, the allowable voltage range and the overcharge voltage range. Additionally, the processor 13 may set the base degree of bending according the voltage range including the battery voltage.

Here, the overdischarge voltage range, the allowable voltage range and the overcharge voltage range may be voltage ranges that are preset according to the voltage specifications of the battery 110.

The overdischarge voltage range may be below the allowable voltage range. The overdischarge voltage range may refer to a voltage range in which the battery 110 degrades fast due to low voltage. For example, when it is assumed that the battery 110 is a general 4.5[V] battery cell, the overdischarge voltage range may be equal to or higher than 0[V] and less than 2[V].

The allowable voltage range may be a voltage range in which charging and discharging of the battery 110 is allowed. That is, the allowable voltage range may be a voltage range in which the state of the battery 110 may be determined to be normal state. Accordingly, when the battery voltage of the battery 110 is included in the allowable voltage range, the battery 110 may maintain its normal state to avoid acceleration of degradation. For example, when it is assumed that the battery 110 is a general 4.5[V] battery cell, the allowable voltage range may be equal to or higher than 2[V] and less than 4[V].

The overcharge voltage range may be above the allowable voltage range. The overcharge voltage range may refer to a voltage range in which the battery 110 degrades fast due to high voltage. For example, when it is assumed that the battery 110 is a general 4.5[V] battery cell, the overcharge voltage range may be equal to or higher than 4[V] and less than 6[V].

Additionally, the degree of bending corresponding to each of the overdischarge voltage range, the allowable voltage range and the overcharge voltage range may be preset differently.

The degree of bending corresponding to the overdischarge voltage range may be set as a first reference degree of bending. The degree of bending corresponding to the allowable voltage range may be set as a second reference degree of bending. The degree of bending corresponding to the overcharge voltage range may be set as a third reference degree of bending.

For example, when the battery voltage is included in the overdischarge voltage range, the processor 13 may set the base degree of bending as the first reference degree of bending. When the battery voltage is included in the allowable voltage range, the processor 13 may set the base degree of bending as the second reference degree of bending. When the battery voltage is included in the overcharge voltage range, the processor 13 may set the base degree of bending as the third reference degree of bending.

The processor 13 may be configured to compare the degree of battery bending with the base degree of bending to determine which is greater.

In detail, the base degree of bending may be set as the reference degree of bending corresponding to the voltage range in which the battery voltage of the battery 110 is included. That is, the processor 13 may compare the base degree of bending set based on the battery voltage of the battery 110 with the degree of battery bending measured by the degree of bending measuring unit 12.

Additionally, the processor 13 may be configured to perform the protection operation for the battery based on the degree of bending comparison result.

In detail, when the degree of battery bending is greater than the base degree of bending, the processor 13 may determine that there is a failure in the battery 110. Accordingly, the processor 13 may perform the protection operation to stop using the failing battery 110. Additionally, when the failure in the battery 110 is detected in the testing step, the processor 13 may perform the protection operation to easily detect the failing battery 110.

For example, in the embodiment of FIG. 2, assume that the degree of battery bending is greater than the base degree of bending due to a failure in the battery 110. The processor 13 may control the operational state of a main relay 120 into turn-off state to prohibit charging and discharging of the battery 110.

Here, the main relay 120 may allow or disallow the charge current and the discharge current of the battery 110 to flow in the high current path according to the operational state. In the embodiment of FIG. 2, a path connecting a positive electrode terminal P+ of the battery pack 100, the battery 110 and a negative electrode terminal P− of the battery pack 100 may be the high current path. The main relay 120 may be placed on the high current path.

That is, the protection operation performed by the processor 13 may be an operation of cutting off the high current path of the battery 110 to prevent the battery 110 from being used.

Another embodiment of the protection operation for the battery 110 performed by the processor 13 will be described with reference to FIG. 4.

Figure 4:
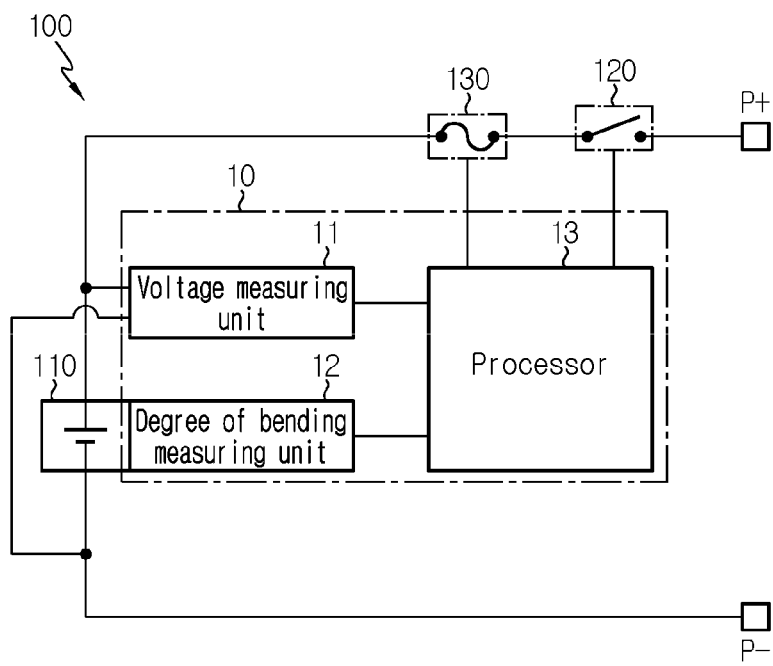
FIG. 4 is a diagram showing an exemplary configuration of another battery pack including a battery management apparatus according to an embodiment of the present disclosure.

FIG. 4 is a diagram showing an exemplary configuration of another battery pack 100 including the battery management apparatus 10 according to an embodiment of the present disclosure.

In the embodiment of FIG. 4, the battery pack 100 may further include a fuse 130.

Preferably, the fuse 130 may be placed on the high current path. Here, the fuse 130 may be a general fuse that blows when a high current flows or overheat occurs.

For example, in the embodiment of FIG. 4, assume that the degree of battery bending is greater than the base degree of bending due to a failure in the battery 110. To perform the protection operation, the processor 13 may control the operational state of the main relay 120 into turn-off state as in the embodiment of FIG. 2. Additionally, the processor 13 may blow the fuse 130 to perform the protection operation. To this end, the processor 13 may output a high voltage signal to the fuse 130, or operate a fuse blowing unit (not shown) to directly blow the fuse 130.

The battery management apparatus 10 according to an embodiment of the present disclosure determines whether there is a failure in the battery 110 considering various states of the battery 110 (the battery voltage and the degree of battery bending), thereby determining whether there is a failure in the battery 110 more accurately.

Additionally, when it is determined that there is a failure in the battery 110, the battery management apparatus 10 may perform the protection operation to prevent the failing battery 110 from being used. Accordingly, it is possible to prevent accidents that may occur when the failing battery 110 is used.

Preferably, the third reference degree of bending may be preset to be less than the first reference degree of bending and the second reference degree of bending.

Here, the third reference degree of bending is the reference degree of bending set to correspond to the overcharge voltage range. Whether to perform the protection operation for the battery 110 may be determined through comparison between the reference degree of bending and the degree of battery bending.

For example, assume that the first reference degree of bending is set to 60, the second reference degree of bending to 50, and the third reference degree of bending to 30. Additionally, assume that the degree of battery bending measured by the degree of bending measuring unit 12 is 40.

In this case, when the battery voltage is included in the overdischarge voltage range or the allowable voltage range, since the base degree of bending is greater than the degree of battery bending, the processor 13 may not perform the protection operation for the battery 110.

On the contrary, when the battery voltage is included in the overcharge voltage range, the base degree of bending may be set as the third reference degree of bending. That is, the base degree of bending may be less than the degree of battery bending. Accordingly, the processor 13 may perform the protection operation for the battery 110.

In general, the internal energy of the battery 110 may be higher when the voltage of the battery 110 is included in the overcharge voltage range than when the voltage of the battery 110 is included in the allowable voltage range or the overdischarge voltage range. That is, when the battery voltage is included in the overcharge voltage range, the battery 110 may be vulnerable to an external impact. Accordingly, when the battery voltage is included in the overcharge range, there is a high likelihood that an accident such as a fire or explosion of the battery 110 will occur when even a small external impact is applied to the battery 110.

Accordingly, the battery management apparatus 10 according to an embodiment of the present disclosure may set different reference degrees of bending depending on the voltage range in which the voltage of the battery 110 is included, so it is possible to detect a failure in the battery 110 resulting from the degree of battery bending more sensitively as the voltage of the battery 110 is higher.

More preferably, the first reference degree of bending, the second reference degree of bending and the third reference degree of bending may be set to reduce in that order.

For example, the third reference degree of bending may be set to be lowest in the overcharge voltage range in which the battery voltage is highest, to perform the protection operation when even a small impact is applied to the battery 110.

When the battery voltage is included in the overdischarge voltage range, the internal energy of the battery 110 is relatively low, and thus the first reference degree of bending may be set to be the highest, thereby performing the protection operation flexibly according to the state of the battery 110.

That is, the battery management apparatus 10 according to an embodiment of the present disclosure performs the protection operation considering both the battery voltage of the battery 110 and the degree of battery bending, thereby performing the protection operation adaptively and flexibly according to the state of the battery 110.

When the battery voltage changes after the base degree of bending is set, the processor 13 may be configured to change the base degree of bending to correspond to the changed battery voltage.

The voltage measuring unit 11 may periodically measure the battery voltage of the battery 110, and output the measured battery voltage to the processor 13. After the base degree of bending is set based on a previous battery voltage, when a new battery voltage different from the previous battery voltage is received, the processor 13 may change the base degree of bending based on the new battery voltage.

In detail, when there is a change in the battery voltage and a consequential change in the voltage range to which the battery voltage belongs, the processor 13 may be configured to change the set base degree of bending to the reference degree of bending corresponding to the changed voltage range.

For example, in the same way as the previous embodiment, assume that the overdischarge voltage range is equal to or higher than 0[V] and less than 2[V], the allowable voltage range is equal to or higher than 2[V] and less than 4[V], and the overcharge voltage range is equal to or higher than 4[V].

When the battery voltage is 3[V] at a first time point, the processor 13 may set the base degree of bending as the second reference degree of bending. Subsequently, when the battery voltage changes to 4[V] at a second time point, the processor 13 may change the base degree of bending from the second reference degree of bending to the third reference degree of bending. In this case, since the base degree of bending at the second time point is less than the base degree of bending at the first time point, the protection operation may be performed according to the degree of battery bending.

That is, the battery management apparatus 10 according to an embodiment of the present disclosure may perform a suitable protection operation corresponding to the state of the battery 110 by changing the base degree of bending to correspond to the change of the battery voltage.

The processor 13 may be configured to set a base time to correspond to the voltage range to which the battery voltage belongs.

In detail, the processor 13 may set the base time according to the voltage range in which the battery voltage is included among the overdischarge voltage range, the allowable voltage range and the overcharge voltage range.

Preferably, a reference time corresponding to the overdischarge voltage range may be set as a first reference time. A reference time corresponding to the allowable voltage range may be set as a second reference time. A reference time corresponding to the overcharge voltage range may be set as a third reference time.

For example, the first reference time may be set to 50 ms, the second reference time to 40 ms, and the third reference time to 30 ms.

That is, the processor 13 may be configured to set the base time as the first reference time when the battery voltage is included in the overdischarge voltage range, the base time as the second reference time when the battery voltage is included in the allowable voltage range, and the base time as the third reference time when the battery voltage is included in the overcharge voltage range.

The processor 13 may be configured to compare an excess time with the base time to determine which is longer, the excess time being an amount of time that passes from the time point at which the degree of battery bending exceeds the base degree of bending.

In detail, the processor 13 may set the base degree of bending and the base time according to the voltage range in which the battery voltage is included. Additionally, the excess time may be measured from the time when the degree of battery bending measured by the degree of bending measuring unit 12 exceeds the set base degree of bending. Preferably, the excess time may be measured until the degree of battery bending is equal to or less than the base degree of bending, or the protection operation for the battery 110 is performed.

That is, when the degree of battery bending is equal to or less than the base degree of bending while the excess time is being measured before the protection operation for the battery 110 is performed, the excess time being measured may be reset. Additionally, when the protection operation for the battery 110 is performed, the excess time being measured may be reset.

The processor 13 may be configured to perform the protection operation for the battery 110 based on the time comparison result.

In detail, the processor 13 may perform the protection operation for the battery 110 when the excess time exceeds the base time.

For example, assume that the base time is set to 50 ms, and the degree of battery bending measured at the first time point exceeds the base degree of bending. Since the degree of battery bending exceeds the base degree of bending, the processor 13 may measure the excess time on the basis of the first time point. When the excess time being measured exceeds 50 ms, the processor 13 may perform the protection operation for the battery 110. On the contrary, when the excess time being measured is equal to or less than 50 ms, and the degree of battery bending changes to be equal to or less than the base degree of bending, the processor 13 may reset the excess time being measured.

The battery management apparatus 10 according to an embodiment of the present disclosure may perform the protection operation for the battery 110 when a continuous external impact or swelling is determined to have occurred by considering the time (the excess time) during which the degree of battery bending is maintained.

When the battery 110 recovers to normal state from an instantaneous impact applied to the battery 110, the processor 13 may not perform the protection operation to increase the service life of the battery 110 and the battery pack 100.

Preferably, the third reference time may be set to be less than the first reference time and the second reference time.

That is, in the same way as the reference degree of bending, the reference time may be differently set depending on the voltage range in which the battery voltage of the battery 110 is included.

As described above, when the battery voltage is included in the overcharge voltage range, the internal energy of the battery 110 may be relatively high. In this case, when an external impact acts on the battery 110 even for a short time, an accident such as explosion of the battery 110 may occur. Additionally, since the internal energy of the battery 110 is high, an accident such as explosion may be serious.

Accordingly, the battery management apparatus 10 according to an embodiment of the present disclosure may set the third reference time to be shorter than the first reference time and the second reference time to prevent an accident caused by the battery 110 considering the battery voltage.

When the battery voltage changes after the base time is set, the processor 13 may be configured to change the base time to correspond to the changed battery voltage.

The voltage measuring unit/voltage measurer 11 may periodically measure the battery voltage of the battery 110, and output the measured battery voltage to the processor 13. Accordingly, the processor 13 may set the base time based on the previous battery voltage, and when a new battery voltage is different from the previous battery voltage, change the base time based on the new battery voltage.

In detail, when there is a change in the battery voltage and a consequential change in the voltage range to which the battery voltage belongs, the processor 13 may change the set the base time to the reference time corresponding to the changed voltage range.

For example, in the same way as the previous embodiment, assume that the overdischarge voltage range is equal to or higher than 0[V] and less than 2[V], the allowable voltage range is equal to or higher than 2[V] and less than 4[V], and the overcharge voltage range is equal to or higher than 4[V].

When the battery voltage is 3[V] at the first time point, the processor 13 may set the base time as the second reference time. Subsequently, when the battery voltage changes to 4[V] at the second time point, the processor 13 may change the base time from the second reference time to the third reference time.

In this case, since the base time at the second time point is shorter than the base time at the first time point, the protection operation may be performed according to the excess time measured from the time when the degree of battery bending exceeds the base degree of bending.

That is, the battery management apparatus 10 according to an embodiment of the present disclosure may perform a suitable protection operation corresponding to the state of the battery 110 by changing the base time to correspond to a change in battery voltage.

More preferably, when the battery voltage changes after the base degree of bending and the base time are set, the processor 13 may be configured to change the base degree of bending and the base time to correspond to the changed battery voltage.

That is, when the battery voltage changes to be included in a different voltage range after the base degree of bending and the base time are set, the processor 13 may change the base degree of bending and the base time to the reference degree of bending and the reference time set in the voltage range in which the changed battery voltage is included respectively.

The battery management apparatus 10 according to an embodiment of the present disclosure may perform the protection operation for the battery 110 by changing the base degree of bending and the base time to correspond to a change in state of the battery 110 (for example, a change in battery voltage). Accordingly, the battery management apparatus 100 may a suitable protection operation corresponding to the state of the battery 110 to prevent an unexpected accident caused by the battery 110.

Hereinafter, various embodiments of the battery pack 100 including the battery management apparatus 10 will be described. It is noted that redundant descriptions are omitted herein.

Figure 5:
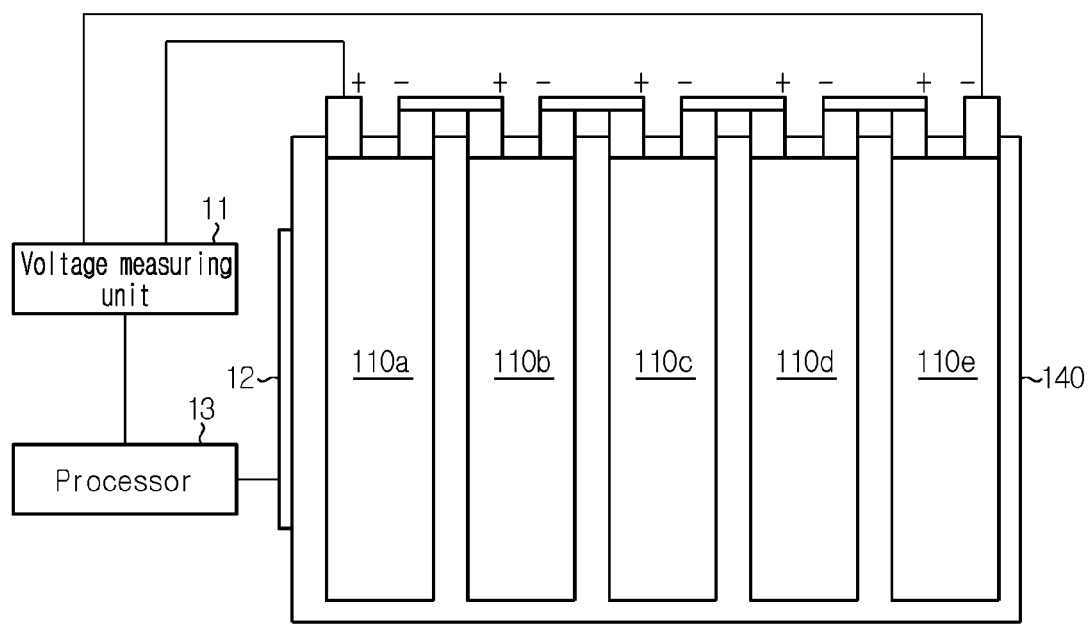
FIG. 5 is a diagram showing another exemplary configuration of a battery management apparatus and a battery according to an embodiment of the present disclosure.

FIG. 5 is a diagram showing another exemplary configuration of the battery management apparatus 10 and the battery 110 according to an embodiment of the present disclosure. In detail, FIG. 5 is a diagram showing an example of the degree of bending measuring unit 12 of the battery management apparatus 10 according to an embodiment of the present disclosure attached to a battery module 140.

Figure 6:
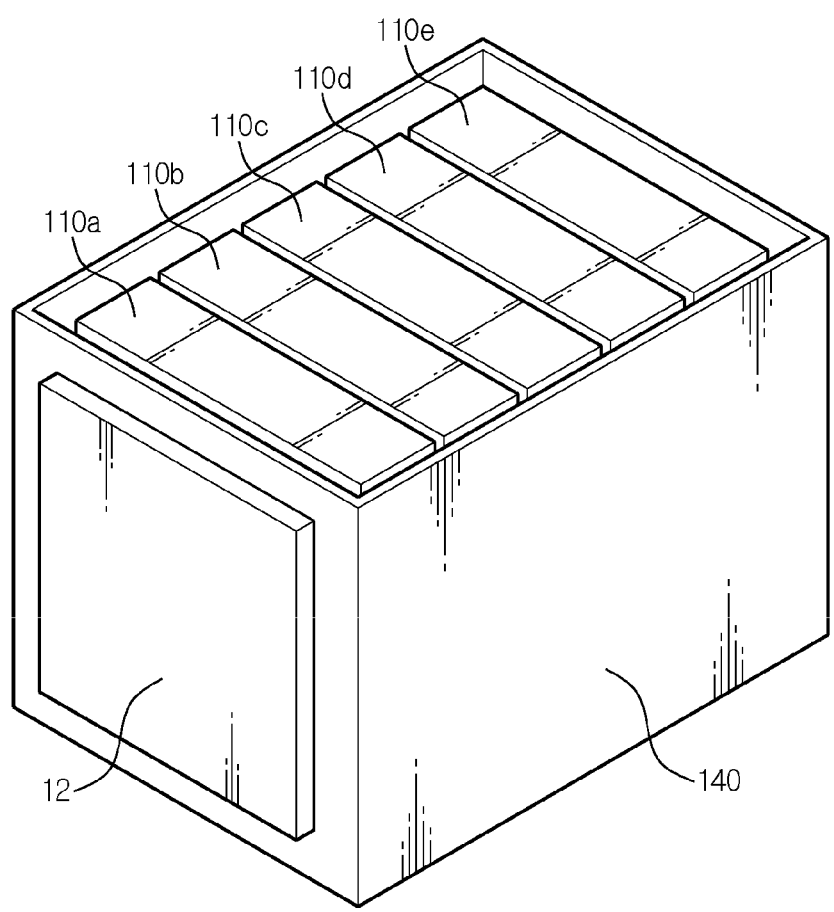
FIG. 6 is a perspective view of the battery of FIG. 5.

FIG. 6 is a perspective view of the battery of FIG. 5. In detail, FIG. 6 is a perspective view of the battery module 140.

Here, the battery 110 may be the battery module 140 including a plurality of battery cells 110*a* to 110*e*. That is, in the embodiment of FIGS. 5 and 6, the battery module 140 including the plurality of battery cells 110*a* to 110*e* may be regarded as the battery 110.

For example, referring to FIGS. 5 and 6, the battery module 140 may include a first battery cell 110*a*, a second battery cell 110*b*, a third battery cell 110*c*, a fourth battery cell 110*d* and a fifth battery cell 110*e*.

The voltage measuring unit 11 may measure the battery voltage of the battery module 140, and the degree of bending measuring unit 12 may measure the degree of battery bending of the battery module 140. Particularly, referring to FIGS. 5 and 6, the degree of bending measuring unit 12 may be attached to one surface of the battery module 140 to measure the degree of battery bending of the battery module 140.

The processor 13 may perform the protection operation for the battery module 140 based on the battery voltage and the degree of battery bending.

That is, the battery management apparatus 10 according to an embodiment of the present disclosure can perform the protection operation for not only the battery cell but also the battery module 140 according to the voltage and the degree of bending.

Figure 7:
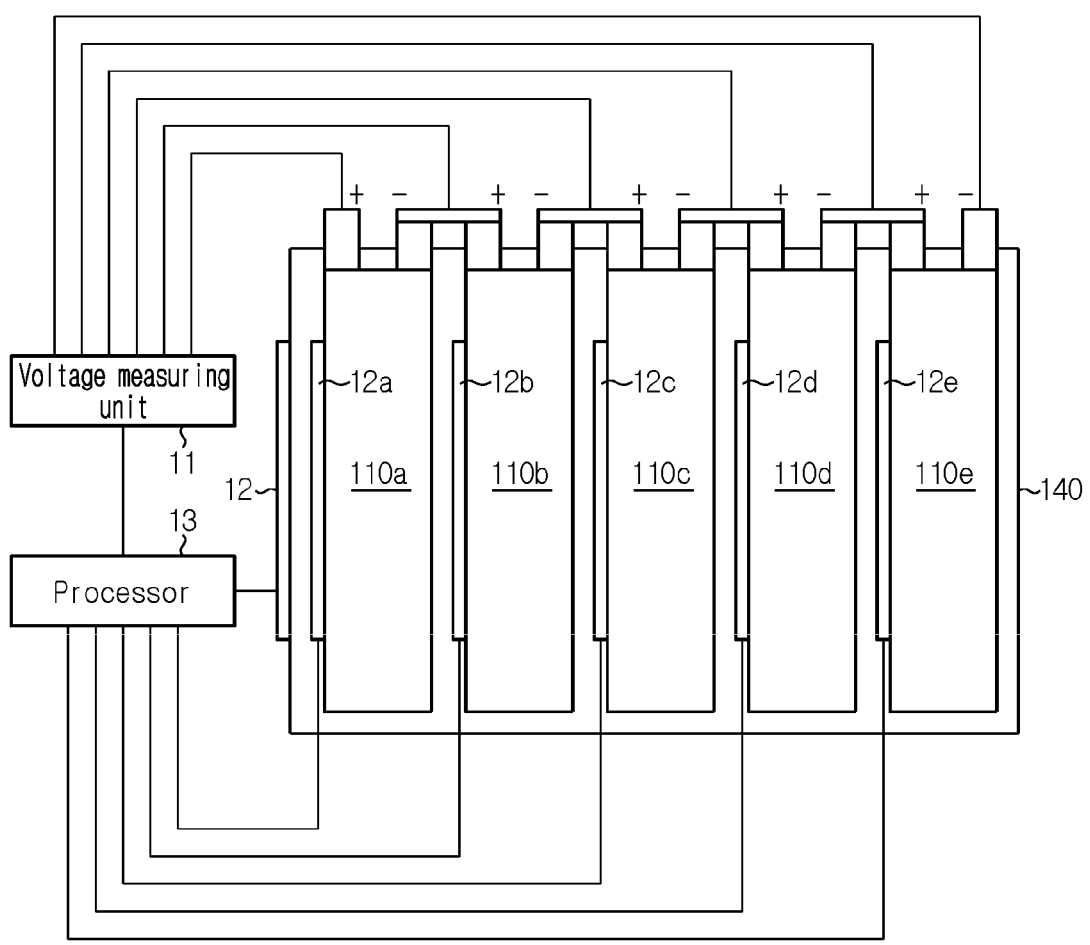
FIG. 7 is a diagram showing still another exemplary configuration of a battery management apparatus and a battery according to an embodiment of the present disclosure.

FIG. 7 is a diagram showing still another exemplary configuration of the battery management apparatus 10 and the battery according to an embodiment of the present disclosure.

In the embodiment of FIG. 7, in the same way as the embodiment of FIGS. 5 and 6, the battery module 140 including the plurality of battery cells 110*a* to 110*e* may be regarded as the battery 110.

The voltage measuring unit 11 may be configured to measure the voltage of the battery module 140 and each of the plurality of battery cells 110*a* to 110*e*.

For example, in the embodiment of FIG. 7, the voltage measuring unit 11 may be connected to each electrode of the plurality of battery cells 110*a* to 110*e*. Additionally, the voltage measuring unit 11 may measure the voltage of the battery module 140 and each of the plurality of battery cells 110*a* to 110*e*.

The degree of bending measuring unit 12 may be provided in the battery module 140 and each of the plurality of battery cells 110*a* to 110*e* to measure the degree of bending of the battery module 140 and each of the plurality of battery cells 110*a* to 110*e*.

Preferably, the degree of bending measuring unit 12 may be attached to the battery module 140 and each of the plurality of battery cells 110*a* to 110*e*.

For example, the degree of bending measuring unit 12 may be attached to the battery module 140. A first degree of bending measuring unit 12*a* may be attached to the first battery cell 110*a*. A second degree of bending measuring unit 12*b* may be attached to the second battery cell 110*b*. A third degree of bending measuring unit 12*c* may be attached to the third battery cell 110*c*. A fourth degree of bending measuring unit 12*d* may be attached to the fourth battery cell 110*d*. A fifth degree of bending measuring unit 12*e* may be attached to the fifth battery cell 110*e*.

The processor 13 may be configured to determine if there is a failure in the battery module 140 based on the degree of bending comparison result and the time comparison result of the battery module 140.

That is, the processor 13 may detect a failure in the battery module 140 before comparing the degree of battery bending and the excess time with the base degree of bending and the base time for each of the plurality of battery cells 110*a* to 110*e*.

For example, when the degree of battery bending of the battery module 140 is equal to or less than the base degree of bending and the excess time is equal to or less than the base time, the processor 13 may determine that there is no failure in the battery module 140. In this case, the processor 13 may omit the failure detection for each of the plurality of battery cells 110a to 110e.

That is, the battery management apparatus 10 may detect a failure in the battery module 140 first, and when a failure is detected in the battery module 140, detect a failure in each of the plurality of battery cells 110a to 110e, thereby reducing the total time required to detect a failure in the battery 110.

In a specific example, when the degree of battery bending of the battery module 140 exceeds the base degree of bending and the excess time also exceeds the base time, the processor 13 may determine that there is a failure in the battery module 140. In this case, the processor 13 may detect a failure in each of the plurality of battery cells 110a to 110e. That is, the processor 13 may detect a failure in each of the plurality of battery cells 110a to 110e to detect a failing cell.

Subsequently, a battery cell having the degree of battery bending exceeding the base degree of bending and the excess time exceeding the base time is detected among the plurality of battery cells 110a to 110e, the processor 13 may perform the protection operation for the battery 110. Additionally, the processor 13 may provide information associated with the detected battery cell, and thus there is an advantage that it is possible to provide information associated with the failing cell.

Figure 8:
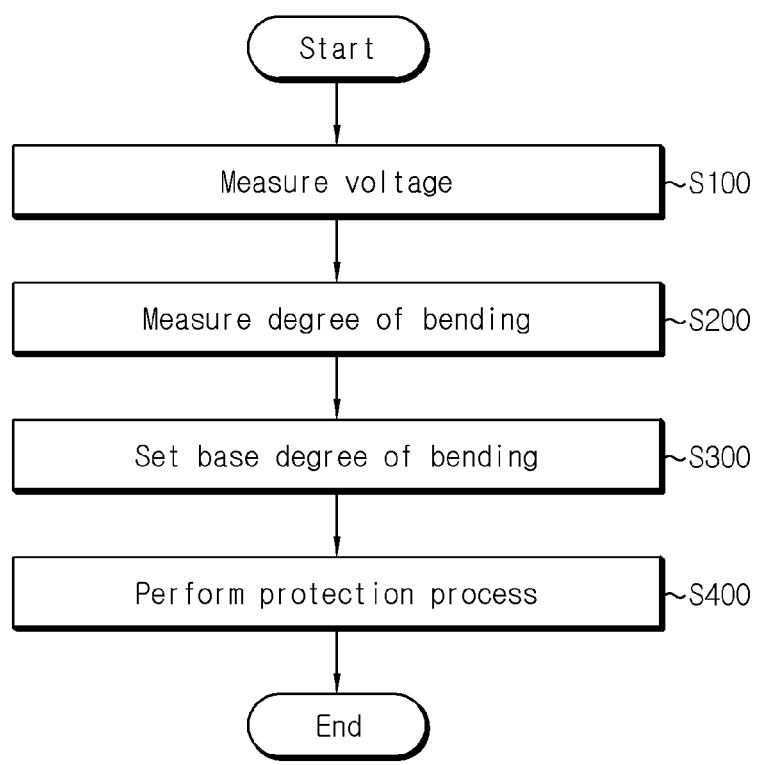
FIG. 8 is a schematic diagram of a battery management method according to another embodiment of the present disclosure.

FIG. 8 is a schematic diagram of a battery management method according to another embodiment of the present disclosure. Here, the battery management method may be performed by each element of the battery management apparatus 10.

Referring to FIG. 8, the battery management method according to another embodiment of the present disclosure may include a voltage measuring step (S100), a degree of bending measuring step (S200), a base degree of bending setting step (S300) and a protection operation performing step (S400).

The voltage measuring step (S100) is a step of measuring the battery voltage of the battery 110, and may be performed by the voltage measuring unit 11.

For example, in the embodiment of FIG. 4, the voltage measuring unit 11 may measure the battery voltage of the battery 110 through a measurement line connected to the two terminals of the battery 110.

The degree of bending measuring step (S200) is a step of measuring the degree of battery bending of the battery 110, and may be performed by the degree of bending measuring unit 12.

For example, in the embodiment of FIG. 3, the degree of bending measuring unit 12 may be attached to one surface of the battery 110 to measure the degree of battery bending of the battery 110.

The base degree of bending setting step (S300) is a step of setting the base degree of bending according to the voltage range in which the battery voltage is included among the overdischarge voltage range, the allowable voltage range and the overcharge voltage range, and may be performed by the processor 13.

First, the processor 13 may determine the voltage range in which the battery voltage measured in the voltage measuring step S100 is included among the overdischarge voltage range, the allowable voltage range and the overcharge voltage range.

Subsequently, the processor 13 may set the base degree of bending based on the reference degree of bending corresponding to the voltage range in which the battery voltage is included. For example, when the battery voltage is included in the allowable voltage range, the processor 13 may set the base degree of bending based on the second reference degree of bending corresponding to the allowable voltage. That is, the processor 13 may set the second reference degree of bending as the base degree of bending.

The protection operation performing step (S400) may include comparing the degree of battery bending with the base degree of bending to determine which is greater, and performing the protection operation for the battery 110 based on the degree of bending comparison result, and may be performed by the processor 13.

When the degree of battery bending exceeds the base degree of bending, the processor 13 may perform the protection operation for the battery 110. For example, in the embodiment of FIG. 4, the processor 13 may blow the fuse 130 or control the operational state of the main relay 120 into turn-off state by performing the protection operation.

Figure 9:
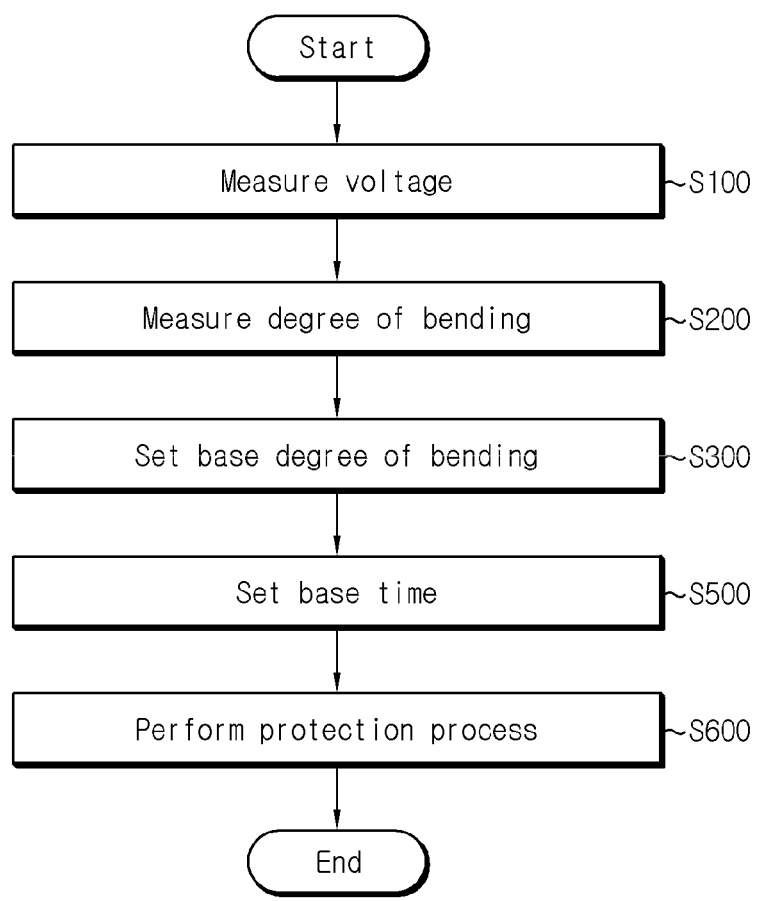
FIG. 9 is a schematic diagram of a battery management method according to still another embodiment of the present disclosure.

FIG. 9 is a schematic diagram of a battery management method according to still another embodiment of the present disclosure. Here, the battery management method may be performed by each element of the battery management apparatus 10. Note that only addition or modification to the method of FIG. 8 will be described below.

Referring to FIG. 9, the battery management method according to still another embodiment of the present disclosure may further include the base time setting step (S500) and the protection operation performing step (S600).

The base time setting step (S500) is a step of setting the base time according to the voltage range in which the battery voltage is included among the overdischarge voltage range, the allowable voltage range and the overcharge voltage range after the base degree of bending setting step (S300), and may be performed by the processor 13.

The processor 13 may set the base time based on the reference time corresponding to the voltage range in which the battery voltage is included. For example, when the battery voltage is included in the allowable voltage range, the processor 13 may set the base time based on the second reference time corresponding to the allowable voltage. That is, the processor 13 may set the second reference time as the base time.

The protection operation performing step (S600) includes performing the protection operation for the battery 110 based on the degree of bending comparison result between the degree of battery bending and the base degree of bending and the time comparison result between the excess time and the base time, and may be performed by the processor 13.

The protection operation performing step (S600) of FIG. 9 may be different from the protection operation performing step (S400) of FIG. 8 in part. In detail, a difference between the protection operation performing step (S400) of FIG. 8 and the protection operation performing step (S600) of FIG. 9 is that the protection operation performing step (S600) of FIG. 9 may further consider the time compare result, compared to the protection operation performing step (S400) of FIG. 8.

For example, when the degree of battery bending exceeds the base degree of bending, and the excess time during which the degree of battery bending exceeds the base degree of bending is longer than the base time, the processor 13 may perform the protection operation for the battery 110. That is, when the degree of battery bending exceeding the base degree of bending lasts longer than the base time, the processor 13 may perform the protection operation for the battery 110.

According to the battery management method, it is possible to prevent an accident caused by the battery 110 when an external impact is applied or swelling occurs.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

DESCRIPTION OF REFERENCE NUMERALS

10: Battery management apparatus
11: Voltage measuring unit
12: Degree of bending measuring unit
13: Processor
100: Battery pack
110: Battery
120: Main relay
130: Fuse
140: Battery module

What is claimed is:

1. A battery management apparatus, comprising:
a voltage measuring unit including a voltage sensor and configured to measure a battery voltage of a battery;
a degree of bending measuring unit including a flexible sensor, provided on at least one side of the battery and configured to measure a degree of battery bending of the battery; and
a processor configured to:
receive the battery voltage from the voltage measuring unit, receive the degree of battery bending from the degree of bending measuring unit,
set a base degree of bending according to a voltage range to which the battery voltage belongs among an overdischarge voltage range, an allowable voltage range and an overcharge voltage range,
compare the degree of battery bending with the base degree of bending to determine which is greater, and
perform a protection operation for the battery based on a degree of bending comparison result,
wherein the processor is further configured to:
set the base degree of bending as a first reference degree of bending when the battery voltage is included in the overdischarge voltage range, a second reference degree of bending when the battery voltage is included in the allowable voltage range, or a third reference degree of bending when the battery voltage is included in the overcharge voltage range.

2. The battery management apparatus according to claim 1, wherein the processor is further configured to:
set the base degree of bending as the first reference degree of bending when the battery voltage is included in the overdischarge voltage range,
set the base degree of bending as the second reference degree of bending when the battery voltage is included in the allowable voltage range, and
set the base degree of bending as the third reference degree of bending when the battery voltage is included in the overcharge voltage range.

3. The battery management apparatus according to claim 2, wherein the third reference degree of bending is set to be less than the first reference degree of bending and less than the second reference degree of bending.

4. The battery management apparatus according to claim 2, wherein the processor is configured to, when the battery voltage changes after the base degree of bending is set, change the base degree of bending to correspond to the changed battery voltage.

5. The battery management apparatus according to claim 4, wherein when there is a change in the battery voltage and a consequential change in the voltage range to which the battery voltage belongs, the processor is configured to change the set base degree of bending to correspond to the changed voltage range.

6. The battery management apparatus according to claim 1, wherein the processor is configured to:
set a base time to correspond to the voltage range to which the battery voltage belongs, and
compare an excess time with the base time to determine which is longer, the excess time being a time that passes from a time point at which the degree of battery bending exceeds the base degree of bending, and perform the protection operation for the battery based on a time comparison result.

7. The battery management apparatus according to claim 6, wherein the processor is configured to:
set the base time as a first reference time when the battery voltage is included in the overdischarge voltage range,
set the base time as a second reference time the battery voltage is included in the allowable voltage range, and
set the base time as a third reference time when the battery voltage is included in the overcharge voltage range.

8. The battery management apparatus according to claim 7, wherein the third reference time is set to be less than the first reference time and less than the second reference time.

9. The battery management apparatus according to claim 7, wherein the processor is configured to, when the battery voltage changes after the base time is set, change the base time to correspond to the changed battery voltage.

10. The battery management apparatus according to claim 9, wherein when there is a change in the battery voltage and a consequential change in the voltage range to which the battery voltage belongs, the processor is configured to change the set base time to correspond to the changed voltage range.

11. The battery management apparatus according to claim 6, wherein the processor is configured to, when the battery voltage changes after the base degree of bending and the base time are set, change the base degree of bending and the base time to correspond to the changed battery voltage.

12. The battery management apparatus according to claim 6, wherein the battery is a battery module including a plurality of battery cells.

13. The battery management apparatus according to claim 12, wherein the voltage measuring unit is configured to measure a voltage of the battery module and each of the plurality of battery cells,
the degree of bending measuring unit is provided in the battery module and each of the plurality of battery cells and is configured to measure a degree of bending of the battery module and each of the plurality of battery cells, and
the processor is configured to:
determine whether there is a failure in the battery module based on a degree of bending comparison result and a time comparison result of the battery module, and
when it is determined that there is the failure in the battery module, detect a failing cell among the plurality of battery cells based on a degree of bending comparison result and a time comparison result for each of the plurality of battery cells.

14. A battery pack comprising the battery management apparatus according to claim 1.

15. A battery management method, comprising:
a voltage measuring step of measuring a battery voltage of a battery;
a degree of bending measuring step of measuring a degree of battery bending of the battery;
a base degree of bending setting step of setting a base degree of bending according to a voltage range in which the battery voltage is included among an overdischarge voltage range, an allowable voltage range and an overcharge voltage range; and
a protection operation performing step of comparing the degree of battery bending with the base degree of bending to determine which is greater, and performing a protection operation for the battery based on a degree of bending comparison result,
wherein the base degree of bending setting step includes:
setting the base degree of bending as a first reference degree of bending when the battery voltage is included in the overdischarge voltage range, a second reference degree of bending when the battery voltage is included in the allowable voltage range, or a third reference degree of bending when the battery voltage is included in the overcharge voltage range.

16. The method of claim 15, further comprising:
setting the base degree of bending as the first reference degree of bending when the battery voltage is included in the overdischarge voltage range,
setting the base degree of bending as the second reference degree of bending when the battery voltage is included in the allowable voltage range, and
setting the base degree of bending as the third reference degree of bending when the battery voltage is included in the overcharge voltage range.

17. The method of claim 15, further comprising:
setting a base time to correspond to the voltage range to which the battery voltage belongs, and
comparing an excess time with the base time to determine which is longer, the excess time being a time that passes from a time point at which the degree of battery bending exceeds the base degree of bending, and performing the protection operation for the battery based on a time comparison result.

* * * * *